US006972986B2

(12) United States Patent
Peng et al.

(10) Patent No.: US 6,972,986 B2
(45) Date of Patent: *Dec. 6, 2005

(54) COMBINATION FIELD PROGRAMMABLE GATE ARRAY ALLOWING DYNAMIC REPROGRAMMABILITY AND NON-VOTATILE PROGRAMMABILITY BASED UPON TRANSISTOR GATE OXIDE BREAKDOWN

(75) Inventors: Jack Zezhong Peng, San Jose, CA (US); Zhongshan Liu, Plano, TX (US); Fei Ye, Cupertino, CA (US); Michael David Fliesler, Santa Cruz, CA (US)

(73) Assignee: Kilopass Technologies, Inc., Santa Clara, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 10/782,564

(22) Filed: Feb. 18, 2004

(65) Prior Publication Data

US 2005/0169039 A1    Aug. 4, 2005

Related U.S. Application Data

(60) Provisional application No. 60/541,470, filed on Feb. 3, 2004.

(51) Int. Cl.[7] ............................................. G11C 11/24
(52) U.S. Cl. ....................... 365/149; 365/205; 326/44
(58) Field of Search ............................. 365/149, 205; 326/44

(56) References Cited

U.S. PATENT DOCUMENTS

| 3,634,929 | A | 1/1972 | Yoshida et al. |
|---|---|---|---|
| 4,322,822 | A | 3/1982 | McPherson |
| 4,488,262 | A | 12/1984 | Basire et al. |
| 4,490,900 | A | 1/1985 | Chiu |
| 4,502,208 | A | 3/1985 | McPherson |
| 4,507,757 | A | 3/1985 | McElroy |
| 4,543,594 | A | 9/1985 | Mohsen et al. |
| 4,546,273 | A | 10/1985 | Osman |
| 4,599,705 | A | 7/1986 | Holmberg et al. |
| 4,613,886 | A | 9/1986 | Chwang |
| 4,677,742 | A | 7/1987 | Johnson |
| 4,758,745 | A | 7/1988 | El Gamal et al. |
| 4,758,986 | A | 7/1988 | Kuo |
| 4,794,562 | A | 12/1988 | Kato et al. |
| 4,823,181 | A | 4/1989 | Mohsen et al. |
| 4,870,302 | A | 9/1989 | Freeman |

(Continued)

FOREIGN PATENT DOCUMENTS

EP          0 295 935 A1   12/1988

(Continued)

OTHER PUBLICATIONS

Miranda, Enrique et al; Analytic Modeling of Leakage Current Through Multiple Breakdown Paths in SiO2 Films; 39th Annual Internatioal Reliability Physics Symposium; Orlando, FL 2001.

(Continued)

Primary Examiner—Huan Hoang
(74) Attorney, Agent, or Firm—Perkins Coie LLP

(57) ABSTRACT

A cell that can be used as a dynamic memory cell for storing data or a field programmable gate array (FPGA) cell for programming is disclosed. The cell includes a capacitor having a first terminal connected to a column bitline and a second terminal connected to a switch control node. A select transistor has a gate connected to the read bitline, a source connected to the switch control node, and a drain connected to a row wordline. The switch control node stores data as a voltage indicative of a one or a zero.

18 Claims, 9 Drawing Sheets

U.S. PATENT DOCUMENTS

| | | |
|---|---|---|
| 4,876,220 A | 10/1989 | Mohsen et al. |
| 4,899,205 A | 2/1990 | Hamdy et al. |
| 4,943,538 A | 7/1990 | Mohsen et al. |
| 4,962,342 A | 10/1990 | Mead et al. |
| 5,138,410 A | 8/1992 | Takebuchi |
| 5,150,179 A | 9/1992 | Gill |
| 5,303,185 A | 4/1994 | Hazani |
| 5,304,871 A | 4/1994 | Dharmarajan et al. |
| 5,323,342 A | 6/1994 | Wada et al. |
| 5,412,244 A | 5/1995 | Hamdy et al. |
| 5,455,525 A | 10/1995 | Ho et al. |
| 5,477,499 A | 12/1995 | Van Buskirk et al. |
| 5,496,756 A | 3/1996 | Sharma et al. |
| 5,576,568 A | 11/1996 | Kowshik |
| 5,578,848 A | 11/1996 | Kwong et al. |
| 5,586,270 A | 12/1996 | Rotier et al. |
| 5,587,603 A | 12/1996 | Kowshik |
| 5,600,265 A | 2/1997 | El Gamal et al. |
| 5,650,336 A | 7/1997 | Eriguchi et al. |
| 5,675,541 A | 10/1997 | Leterrier |
| 5,675,547 A | 10/1997 | Koga |
| 5,745,417 A | 4/1998 | Kobayashi et al. |
| 5,781,032 A | 7/1998 | Bertolet et al. |
| 5,784,636 A | 7/1998 | Rupp |
| 5,825,200 A | 10/1998 | Kolze |
| 5,825,201 A | 10/1998 | Kolze |
| 5,880,512 A | 3/1999 | Gordon et al. |
| 5,889,411 A | 3/1999 | Chaudhary |
| 5,892,962 A | 4/1999 | Cloutier |
| 5,909,049 A | 6/1999 | McCollum |
| 5,929,482 A | 7/1999 | Kawakami |
| 5,986,931 A | 11/1999 | Caywood |
| 5,986,939 A | 11/1999 | Yamada |
| 6,016,268 A * | 1/2000 | Worley ..................... 365/149 |
| 6,031,761 A | 2/2000 | Ghilardelli et al. |
| 6,034,893 A | 3/2000 | Mehta |
| 6,040,968 A | 3/2000 | Duvvury et al. |
| 6,047,243 A | 4/2000 | Bang |
| 6,064,225 A | 5/2000 | Andrews et al. |
| 6,064,595 A | 5/2000 | Logie et al. |
| 6,077,719 A | 6/2000 | Koike |
| 6,084,428 A | 7/2000 | Kolze et al. |
| 6,097,077 A | 8/2000 | Gordon et al. |
| 6,153,463 A | 11/2000 | Wei et al. |
| 6,157,568 A | 12/2000 | Schmidt |
| 6,166,954 A | 12/2000 | Chern |
| 6,198,652 B1 | 3/2001 | Kawakubo |
| 6,214,666 B1 | 4/2001 | Mehta |
| 6,215,140 B1 | 4/2001 | Reisinger et al. |
| 6,218,274 B1 | 4/2001 | Komatsu |
| 6,232,631 B1 | 5/2001 | Schmidt et al. |
| 6,236,229 B1 | 5/2001 | Or-Bach |
| 6,249,809 B1 | 6/2001 | Bro |
| 6,282,123 B1 | 8/2001 | Mehta |
| 6,294,809 B1 | 9/2001 | Logie |
| 6,297,103 B1 | 10/2001 | Ahn et al. |
| 6,304,666 B1 | 10/2001 | Warren et al. |
| 6,337,250 B2 | 1/2002 | Furuhata |
| 6,351,428 B2 | 2/2002 | Forbes |
| 6,421,293 B1 | 7/2002 | Candelier et al. |
| 6,431,456 B2 | 8/2002 | Nishizawa et al. |
| 6,445,619 B1 | 9/2002 | Mihnea et al. |
| 6,456,535 B2 | 9/2002 | Forbes et al. |
| 6,459,634 B1 | 10/2002 | Sher |
| 6,476,636 B1 | 11/2002 | Lien et al. |
| 6,515,509 B1 | 2/2003 | Baxter |
| 6,556,481 B1 | 4/2003 | Hsu et al. |
| 6,602,729 B2 | 8/2003 | Lin |
| 6,633,182 B2 | 10/2003 | Pileggi et al. |
| 6,650,143 B1 * | 11/2003 | Peng ........................... 326/44 |
| 6,674,670 B2 | 1/2004 | Jeung |
| 6,678,646 B1 | 1/2004 | McConnell et al. |
| 6,700,151 B2 | 3/2004 | Peng |
| 6,753,590 B2 | 6/2004 | Fifield et al. |
| 6,754,881 B2 | 6/2004 | Kuhlmann et al. |
| 6,777,757 B2 | 8/2004 | Peng et al. |
| 6,862,205 B2 * | 3/2005 | Agata et al. ................ 365/149 |
| 6,910,069 B1 | 6/2005 | Bourassa et al. |
| 2001/0003374 A1 | 6/2001 | Bohmer et al. |
| 2003/0218920 A1 | 11/2003 | Harari |

FOREIGN PATENT DOCUMENTS

JP                  61292295          12/1986

OTHER PUBLICATIONS

Lombardo; S. et al; Softening of Breakdown in Ultra-Thin Gate Oxide nMOSFET's at Low Inversion Layer Density; 39th Annual International Reliability Physics Symposium; Orlando, FL 2001.

Wu, E.W. et al; Voltage-Dependent Voltage-Acceleration of Oxide Breakdown for Ultra-Thin Oxides; IEEE, 2000.

Rasras, Mahmoud et al; Substrate Hole Current Origin After Oxide Breakdown; IEEE, 2000.

Sune, Jordi et al; Post Soft Breakdown Conduction in SiO2 Gate Oxides; IEEE, 2000.

DeGraaf, C., et al, A Novel High-Density Low-Cost Diode Programmable Read Only Memory, IEEE, 1996.

* cited by examiner 0.18um LV XPM FPGA CELL OPERATION

| | | VBL | VBLR | VWL | | | PROGRAM | |
|---|---|---|---|---|---|---|---|---|
| PROGRAM | SC/SR | 8 | 3.3 | 0 | | | YES | ⟩ 301 |
| | SC/UR | 8 | 3.3 | 3.3 | | | NO | ⟩ 303 |
| | UC/SR | 0 | 0 | 0 | | | NO | ⟩ 305 |
| | UC/UR | 0 | 0 | 3.3 | | | NO | ⟩ 307 |
| | | | | | | | SENSE CURRENT | ⟩ 309 |
| READ | SC/SR | 1.8 - 3.3 | 1.8 | 0 | | | YES | ⟩ 311 |
| | SC/UR | 1.8 - 3.3 | 1.8 | 1.8 | | | NO | ⟩ 313 |
| | UC/SR | 0 | 0 | 0 | | | NO | ⟩ 315 |
| | UC/UR | 0 | 0 | 1.8 | | | NO | |
| | | | | | | | | |
| OPERATION | | 1.8 | 0 - 0.8 | 0 | | | | ⟩ 317 |

FIGURE 3

0.18um IO XPM FPGA CELL OPERATION

| | | VBL | VBR | VWL | | | PROGRAM | |
|---|---|---|---|---|---|---|---|---|
| PROGRAM | SC/SR | 8 | 3.3 | 0 | | | YES | ⟩ 401 |
| | SC/UR | 8 | 3.3 | 3.3 | | | NO | ⟩ 403 |
| | UC/SR | 0 | 0 | 0 | | | NO | ⟩ 405 |
| | UC/UR | 0 | 0 | 3.3 | | | NO | ⟩ 407 |
| | | | | | | | SENSE CURRENT | ⟩ 409 |
| READ | SC/SR | 3.3 | 3.3 | 0 | | | YES | ⟩ 411 |
| | SC/UR | 3.3 | 3.3 | 3.3 | | | NO | ⟩ 413 |
| | UC/SR | 0 | 0 | 0 | | | NO | ⟩ 415 |
| | UC/UR | 0 | 0 | 3.3 | | | NO | |
| | | | | | | | | ⟩ 417 |
| OPERATION | | 3.3 | 0.3 - 0.8 | 0 | | | YES | |

FIGURE 4

DYNAMIC XPM FPGA CELL OPERATION

| | | VBW | VBP | VWL(1) | VWL(0) |
|---|---|---|---|---|---|
| WRITE OR REFRESHING BY COLUMNS | SC | $V_{cc}$ | 0 | $V_{cc}$ | 0 |
| | UC | 0 | 0 | $V_{cc}$ | 0 |

*SC-SELECTED COLUMN; UC-UNSELECTED COLUMN

US 6,972,986 B2

COMBINATION FIELD PROGRAMMABLE GATE ARRAY ALLOWING DYNAMIC REPROGRAMMABILITY AND NON-VOTATILE PROGRAMMABILITY BASED UPON TRANSISTOR GATE OXIDE BREAKDOWN

CROSS REFERENCE TO RELATED APPLICATIONS

This application claims the benefit of provisional U.S. Patent Application No. 60/541,470, filed Feb. 3, 2004, which is hereby incorporated by reference in its entirety.

TECHNICAL FIELD OF THE INVENTION

The present invention relates to field programmable gate arrays (FPGA), and more particularly, to a FPGA that allows for both dynamic reprogrammability by refreshing of charge and non-volatile one-time programmability based upon the breakdown of the gate oxide of a transistor.

BACKGROUND OF THE INVENTION

FPGA's are finding increasing application as logic and/or processing elements.

One type of FPGA utilizes SRAM cells, which requires six transistors. The SRAM is used to provide configurable or programmable switches. The programming is stored as a bitmap typically off chip in non-volatile memory. The SRAM based FPGA is programmed by first programming the non-volatile memory. Then, the bitstram from the non-volatile memory is loaded from the non-volatile memory to the SRAM. The SRAM then is used to control the FPGA. This multi-chip solution results in a large form factor and relatively high cost.

Another type of FPGA is based upon anti-fuse technology. Although widely accepted, anti-fuse technology requires specialized fuse manufacturing process. Further, a FPGA based upon anti-fuse technology can only be programmed once.

Yet another type of FPGA is based upon flash memory technology. However, flash memory technology requires a relatively more complex semiconductor manufacturing process, thereby increasing cost. Further, flash memory technology is typically one to two generations behind advanced CMOS logic processes.

BRIEF DESCRIPTION OF THE DRAWINGS

FIG. 3 is a table of voltages showing the operation of the FPGA cell of FIGS. 1–3.

FIG. 4 is a table of voltages showing the operation of an alternative embodiment of a FPGA cell.

DETAILED DESCRIPTION

A FPGA based on transistors having an ultra-thin dielectric that can be stressed into breakdown (soft or hard breakdown) to set a leakage current level is disclosed. A suitable ultra-thin dielectric is the high quality gate oxide of about 50 Å thickness or less used in a transistor, as is commonly available from presently available advanced CMOS logic processes. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is related to gate oxide breakdown based flash memory designs developed by the present inventor and assigned to the same assignee as the present invention. Examples are shown in U.S. patent application Ser. No. 09/955,641 filed on Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed on Dec. 17, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 09/982,034 filed on Oct. 17, 2001 entitled "SMART CARD HAVING NON-VOLATILE MEMORY FORMED FROM LOGIC PROCESS", U.S. patent application Ser. No. 09/982,314 filed on Oct. 17, 2001 entitled "REPROGRAMMABLE NON-VOLATILE OXIDE MEMORY FORMED FROM LOGIC PROCESS", and U.S. patent application Ser. No. 10/133,604 filed Apr. 26, 2002 entitled "HIGH DENSITY SEMICONDUCTOR MEMORY CELL AND MEMORY ARRAY USING A SINGLE TRANSISTOR", each of which is hereby incorporated by reference.

Figure 1:
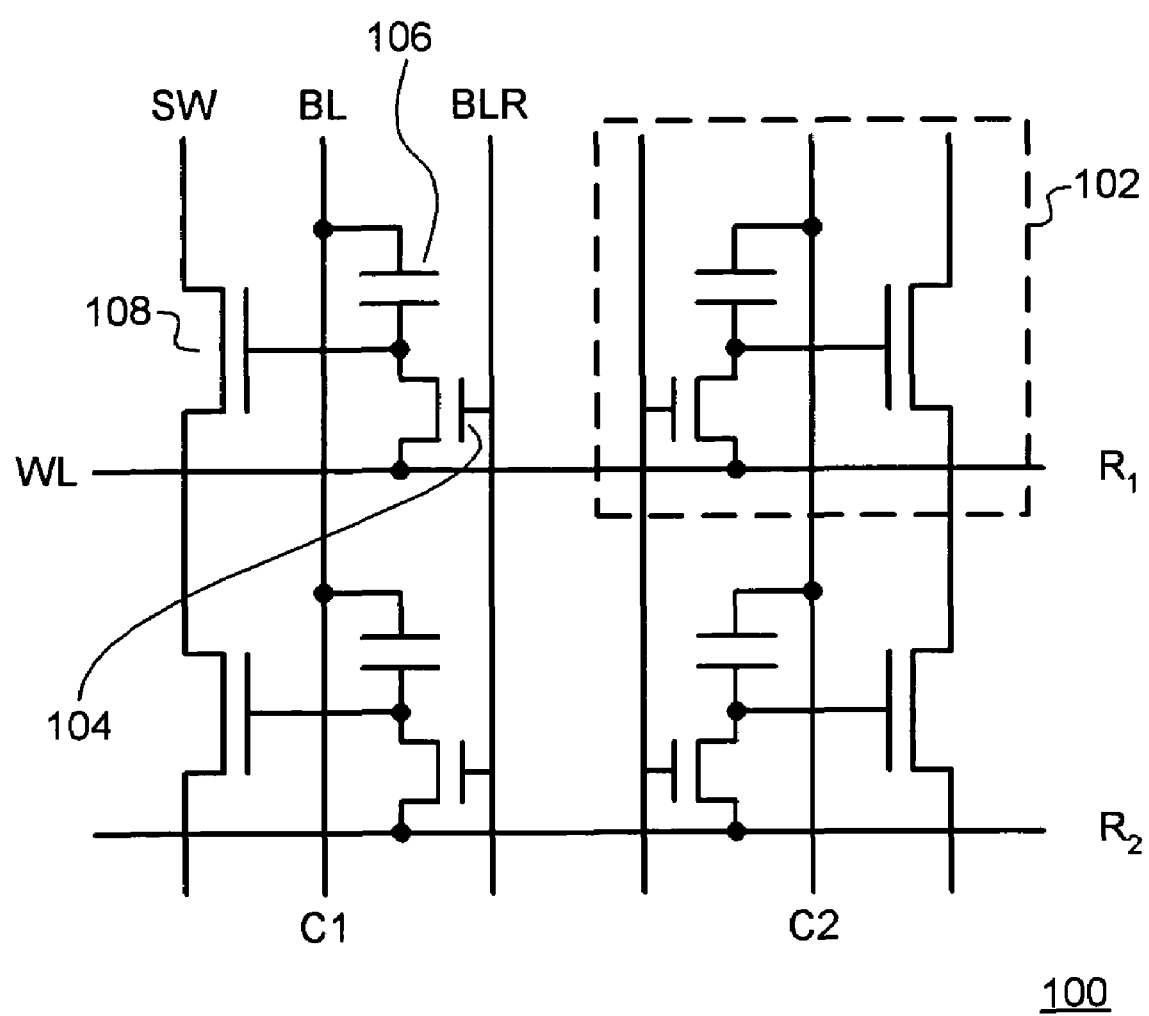
FIG. 1 is a schematic circuit diagram of a portion of a FPGA in accordance with one aspect of the present invention.

FIG. 1 shows an example of a FPGA array 100 formed in accordance of with the present invention. The array 100 is a two column by two row array, however, it can be appreciated that the array can be any arbitrary size. The array 100 includes four memory cells 102, each of which comprises a select transistor 104, a capacitor 106, and a switch 108.

Examining the memory cell 102 at, for example, the crosspoint of the first row $R_1$ and the first column $C_1$ (also referred to herein as a "bitline" or "column bitline"), the memory cell 102 has the gate of its select transistor 104 connected to a read bitline (BLR) line. The drain of the select transistor 104 is connected to a row line $R_1$ (also referred to herein as a "wordline" or "row wordline"). The source of the select transistor 104 is connected to one terminal of the capacitor 106. The other terminal of the capacitor is connected to the column bitline (BL).

The gate of the switch 108 is also connected to the source of the select transistor 104, thusly, between the source and one terminal of the capacitor 106. This connection point is referred to as a switch control node. The source and drain of the switch 108 are connected in a "daisy chain" manner with the other switches common to that column.

As will be seen below, during the programming step, a relatively large voltage is across the capacitor 106 of the selected column and selected row to break down the gate oxide of the capacitor 106. The other memory cells 102 shown in FIG. 1 are also formed from, in one embodiment, identical cells 102 at the crosspoints of the column bitlines $C_x$ and row wordlines $R_y$, where y=1 to N and N is the total number of rows and where x=1 to M and M is the total number of columns.

The use of memory cells 102 as programmed elements in the FPGA 100 of FIG. 1 is advantageous because the components can be fabricated using many conventional CMOS processes using only a single polysilicon deposition step, without adding any mask steps to them. This is in contrast to "floating gate" type FPGA flash memory, which requires at least two polysilicon layers. This is also in contrast to the anti-fuse type FPGA, which requires special process steps. Further, with modern technological advances, the size of a capacitor and transistor can be made very small. For example, current 0.18 micron, 0.13 micron, and smaller line width processes would greatly increase the density of the FPGA.

Although only a two by two FPGA array 100 is shown, in practice such FPGA arrays may contain tens of thousands cells, or even millions of cells, when fabricated using, for example, an advanced 0.13 $\mu$m CMOS logic process. Even larger arrays will be realized as CMOS logic processes improve further.

Figure 2:
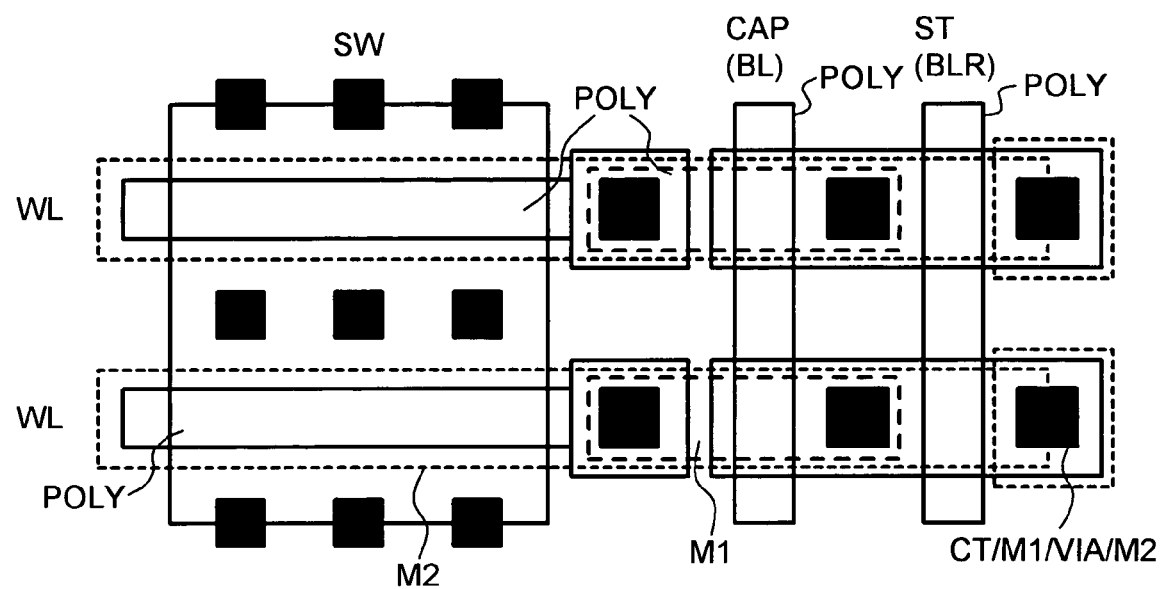
FIG. 2 is a partial layout diagram of a portion of the FPGA represented by FIG. 1.

FIG. 2 shows a partial layout diagram 200 for a portion of the FPGA array 100. The layout diagram of FIG. 2 is suitable for an advanced CMOS logic process. The term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms (50 A for 0.25 um, 30A for 0.18 um and 20A for 0.13 um process) thick is used.

The FPGA array 100 preferably is laid out in a grid in which the column lines such as $C_1$ and $C_2$, are orthogonal to the row lines such as $R_1$ and $R_2$. FIG. 2 shows two cells 102, arrayed as one column by two rows. As seen in FIG. 2, the metal one (M1) line is used to connect the gate of the switch (SW) with one terminal of the capacitor 106. Further, the drain of the select transistor (ST and 104) is connected to the word line through a n+ diffusion contact, metal one, via one, and metal two (M2). Further, it can be seen that all of the devices (select transistor 104, capacitor 106, and switch 108) are formed from a polysilicon layer over a low voltage (LV) oxide.

The operation of the FPGA array 100 is now explained with reference to the illustrative voltages shown in FIG. 3. It will be appreciated that the voltages are illustrative, and that different voltages are likely to be used in different applications or when different process technologies are used. During programming, the various cells in the FPGA array 100 are exposed to one of four possible programming voltage combinations, which are shown on lines 301, 303, 305, and 307 of FIG. 3. Read voltages are shown on lines 309, 311, 313, and 315. Assume that a FPGA cell 102 (note that the cell 102 in FIG. 2 is a generic reference to all of the cells in the FPGA 100) is selected for programming and is located at the crosspoint of $R_1$ and $C_1$. The selected memory cell 102 is referred to as at the selected row and selected column ("SR/SC"). As shown on line 301, the voltage on the selected wordline $R_1$ (designated as $V_{w1}$ or "voltage on the wordline") is 0 volts and the voltage on the bitline $C_1$ (designated as $V_{bl}$ or "voltage on the bitline") is 8 volts. Further, the voltage on the selected read bitline (designated as $V_{blr}$ or "voltage on the read bitline") is 3.3 volts.

This set of voltages results in the select transistor 104 being "on", which places 0 volts from the word line onto one terminal of the capactior 106. The other terminal of the capacitor 106 is connected to the bitline ($V_{bl}$) which is at 8 volts. Thus, the voltage across the capacitor 106 is 8 volts. The gate oxide of the capacitor 106 is designed to break down at this potential difference, which programs the FPGA cell as will be described further below. When the oxide of the capacitor 106 breaks down, this converts the capacitor 106 into a resistor.

It can be appreciated that the precise magnitude of voltages applied is dependent upon the thickness of the gate oxide and other factors. Thus, for example, for a 0.13 micron CMOS process, the gate oxide is typically thinner, thereby requiring a lower voltage differential across the capacitor 106.

With $R_1$ and $C_1$ being the selected row and column, consider the impact on the FPGA cell 102 at the crosspoint of a selected row and an unselected column ("SR/UC"), e.g., $R_1$ and $C_2$. As shown on line 305, the voltage on the wordline $R_1$ is 0 volts, the voltage at the unselected read bitline ($V_{blr}$) is 0 and the voltage on the unselected bitline $C_2$ is 0. Because 0 volts is on the gate of the select transistor 104, the FPGA cell 102 does not program under these conditions.

With $R_1$ and $C_1$ being the selected row and column, consider the impact on the FPGA cell 102 at the crosspoint of a selected column and an unselected row ("UR/SC"), e.g. $R_2$ and $C_1$. As shown on line 303, the voltage on the unselected wordline $R_2$ is 3.3 volts, the voltage at the selected read bitline ($V_{blr}$) is 3.3 volts, and the voltage on the bit line $C_1$ is 8 volts. Because the read bitline voltage is 3.3 volts, this causes the select transistor 104 to be in an "on" condition, allowing the 3.3 volts on the word line to be placed on one terminal of the capacitor 106. The other terminal of the capacitor is tied to the voltage on the bitline, or in this case 8 volts. This causes a potential difference of 4.7 volts across the gate oxide of the capacitor 106. The memory cell 102 is designed to not program under these conditions.

With $R_1$ and $C_1$ being the selected row and column, consider the impact on the FPGA cell 102 at the crosspoint of an unselected column and an unselected row ("UR/UC"), e.g. $R_2$ and $C_2$. As shown on line 307, the voltage on the unselected wordline $R_2$ is 3.3 volts, the voltage at the unselected read bitline ($V_{blr}$) is 0 volts, and the voltage on the unselected bitline $C_2$ is 0 volts. Because 0 volts is on the gate of the select transistor 104, the select transistor is in the "off" position, leaving one terminal of the capacitor 106 floating. The other terminal of the capacitor 106 is at 0 volts by virtue of its connection to the bitline. FPGA cell 102 does not program under these conditions.

After a FPGA cell 102 has been programmed by breaking down the gate oxide of the capacitor 106, the physical characteristics of the cell 102 is changed. In particular, the capacitor 106 becomes a resistive element. Note that, during programming, although the voltage across the select transistor oxide (i.e. 3.3 volts on the gate of the select transistor 104) is larger than is typical (1.8 volts for 0.18 micron CMOS), this higher voltage will not break down the gate oxide of the select transistor 104 because of the short programming time (normally less than a few seconds).

The FPGA array 100 is read in the following manner. A read select voltage of 1.8–3.3 volts is placed on the selected column bitline ("SC"), a read select voltage of 1.8 volts is placed on the selected bitline read ($V_{blr}$), and a voltage of 0 volts is placed on the selected row wordline ("SR"). Note that these voltages are for a typical 0.18 micron CMOS process. Lower voltages would be typically used for smaller more advanced CMOS processes. For example, for a 0.13 micron CMOS process, the read select voltage on the selected column bitline and on the selected read bitline may be approximately 1.2 volts.

Assume that $R_1$ and $C_1$ are the selected row and column ("SC/SR") and that the FPGA cell 102 at that crosspoint is programmed. As shown on line 309, 1.8–3.3 volts (a read select voltage) is applied via bitline $C_1$ to one terminal of the capacitor 106. Note that a higher bitline voltage will enable a higher read current to be sensed from the bitline. Further, the gate of the select transistor 104 has applied 1.8 volts via the read bitline and 0 volts is applied to the drain of the select transistor 104 via the wordline $R_1$. This causes the select transistor 104 to be "on". Nevertheless, even though the select transistor is "on", there is still some amount of resistance across the select transistor. Furthermore, there is 1.8–3.3 volts across the capacitor 106, which if programmed, will cause a leakage current (typically over 10 microamps) to flow from the selected column bitline to the selected row wordline. In effect, the programmed capacitor 106 and the select transistor 104 form a voltage divider, whose middle node is connected to the gate of the switch 108. The result of this voltage divider is that a voltage is placed on the gate of the switch 108 sufficient to turn on the switch 108. If the cell 102 has not been previously programmed, the capacitor 106 has a much higher resistance than the select transistor 104. Further, because the select transistor 104 is turned on, this causes the wordline voltage of 0 volts to be placed on the switch 108, which causes the switch 108 to be off.

With $R_1$ and $C_1$ being the selected row and column for the read operation, consider the impact on the cell 102 at the crosspoint of a selected column and an unselected row ("UR/SC"), e.g. $R_2$ and $C_1$. As shown on line 311, 1.8–3.3 volts (a read select voltage) is applied via bitline $C_1$ to one terminal of the capacitor 106. Further, the gate of the select transistor 104 has applied 1.8 volts via the read bitline and 1.8 volts is applied to the source of the select transistor 104 via the wordline $R_1$. This causes the select transistor 104 to be "off".

With $R_1$ and $C_1$ being the selected row and column for the read operation, consider the impact on the cell 102 at the crosspoint of an unselected column and a selected row ("SR/UC"), e.g. $R_1$ and $C_2$. As shown on line 313, 0 volts (a read select voltage) is applied via bitline $C_2$ to one terminal of the capacitor 106. Further, the gate of the select transistor 104 has applied 0 volts via the read bitline and 0 volts is applied to the drain/source of the select transistor 104 via the wordline $R_1$. Under these circumstances, there will no current flow from the wordline to the bitline.

With $R_1$ and $C_1$ being the selected row and column for the read operation, consider the impact on the cell 102 at the crosspoint of an unselected column and a selected row ("UR/UC"), e.g. $R_2$ and $C_2$. As shown on line 315, 0 volts (a read select voltage) is applied via bitline $C_2$ to one terminal of the capacitor 106. Further, the gate of the select transistor 104 has applied 0 volts via the read bitline and 1.8 volts is applied to the drain/source of the select transistor 104 via the wordline $R_2$. Under these circumstances, since the selected device 104 is at off state, there will no current flow from the wordline to the bitline.

During operation, the following voltages are used. First, a wordline voltage of 0 volts is applied. Next, a bitline voltage of 1.8 volts is applied and a bitline read voltage of 0 to 0.8 volts is applied. The $V_{blr}$ of 0 to 0.8 volts is applied to make the select transistor 104 operate in a weakly on state, so only minimal leakage current occurs (on the order of nA).

In the embodiment described in FIGS. 1–3, the gate voltage of the switch 108 will be generally equal or less that $V_{cc}$ (1.8 volts for a 0.18 micron CMOS process). Thus, the switch 108 can only pass $V_{cc}-V_t$. This will affect the speed performance of the FPGA circuit. In an alternative embodiment, the switch 108 and the select transistor 104 have their gate oxides formed thicker, such as that used in input/output devices. For example, the thickness of the gate oxides for the switch 108 and the select transistor 104 may be on the order of 60 angstroms or thicker. The gate oxide of the capacitor 106 should be maintained at the conventional thickness for the particular CMOS process, e.g. 30 angstroms for a 0.18 CMOS process. The programming and read voltages for this alternative embodiment are shown in FIG. 4.

In this alternative embodiment, during the read and programming operations, the bitline voltage can be biased to 3.3 volts (compared to 1.8 volts in the embodiment of FIGS. 1–3). The switch 108 will have 3.3 volts on its gate, so it can fully pass a $V_{cc}$ with extra drive gate voltage. Thus, the programmed switch will have very low resistance so as to impove the speed performance.

Figures 5, 6:
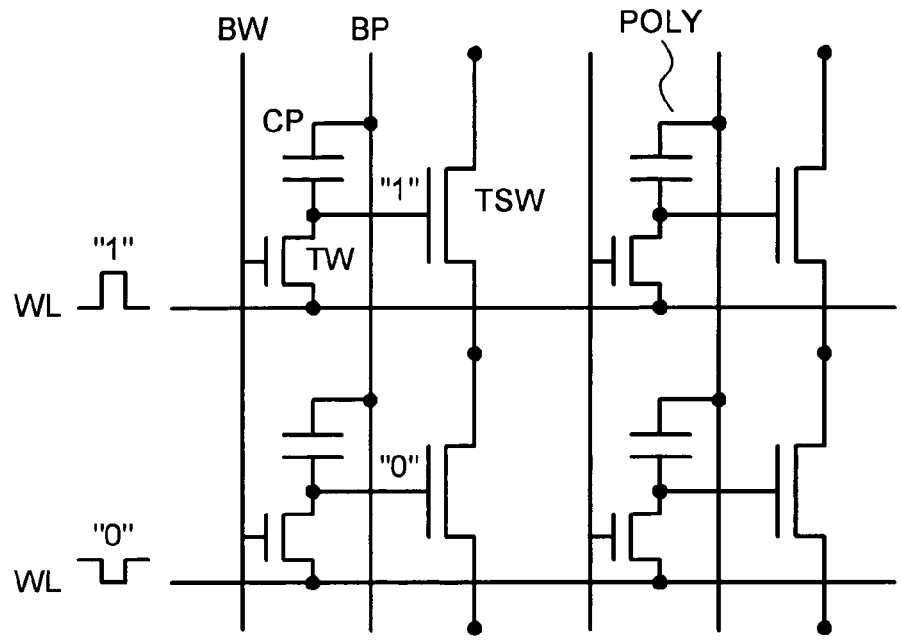
FIG. 5 is a schematic circuit diagram of a portion of a FPGA in accordance with another aspect of the present invention.
FIG. 6 is a table of voltages showing the operation of the FPGA cell of FIG. 5.

While the above description for an FPGA provides significant improvement over the prior art, further improvement can be made to include dynamic reprogrammability as shown in the embodiments of FIGS. 5–11. For example, turning to FIG. 5, a FPGA array is shown that includes a write transistor (Tw), a programming capacitor (Cp) that is made of gate poly over the thin gate oxide, and a control switch device (Tsw) that is used to control the programming logic. The structure of FIG. 5 is similar to that of FIG. 1; however, the operation is different when the memory array is used as dynamic memory. The operation for non-volatile memory operation is the same as described above. Note that new nomenclature is used in FIG. 5, where Bw (equivalent to Blr) is the bitline for writing, Bp (equivalent to Bl) is the bit line for non-volatile programming, WL is the word line. Vg-sw is the switch gate voltage.

Importantly, before the "hard" non-volatile programming (applying voltage to the Cp to breakdown the Gox), the cell can be used as dynamic memory by constant writing or refreshing of the charge stored in the switch gate and Cp. In this manner, the array can also be used as a DRAM style memory device. Specifically, the cell operation is detailed in FIG. 6.

The writing or refreshing (rewriting) is done column by column by selecting all WL (row word line) lines and one write column bit line (Bw). Write or refresh of "1's" is done by setting Vwl to high (Vcc), and "0's" by setting Vwl to low (0V). The unselected columns (Vbw) are all at 0V. Therefore, as seen in FIG. 6, if a cell is to be written with a "1", then the Bw line is high, the Bp line is low, and the WL is high. If a cell is to be written with a "0", then the Bw line is high, the Bp line is low, and the WL is low.

In one example, Vcc=1.8V for a 0.18 um process. In order for the write transistor Tw (which is typically implemented as a NMOS transistor) to fully pass the "1", it is advantageous in some embodiments to use a lower Vdd (for example from 1.8V to 1.2V) in the FPGA logic circuits for higher speed and lower power consumption.

For example, assume that the memory array of FIG. 5 is to be used as dynamic memory and written with dynamic data. In such an operation, the "bit stream" for a specific column (the bit stream may be, for example switch control data for the FPGA) is loaded from, for example, external or on chip EPROM or flash to WL shift registers (not shown). If there are 1024 WLs (rows), then 1024 bits data will be read into 1024 bit shift registers. Then, the selected column Bw is at $V_{cc}$ and 1024 bits in the column are simultaneously written to by the shift registers, with "1's" at $V_{cc}$ and "0's" at 0 volts.

After the first column has been written (synonymous with refreshing), the bit stream for the $2^{nd}$ column is loaded into the shift registers, and the $2^{nd}$ column (Bw) is selected and refreshed. This operation is repeated column by column until the last column has been written or refreshed. The process is repeated again from the $1^{st}$ column, $2^{nd}$ column . . . , and so on. Thus, the columns are constantly refreshed in a serial manner.

The write or refresh time is on the order of a few nS to uS for one column. If there are 1024 columns, then the refresh cycle time is in the range of a few uS to mS range. In one embodiment, the charge stored on the switch gate will not be reduced more than 10% within this time range.

Figure 7:
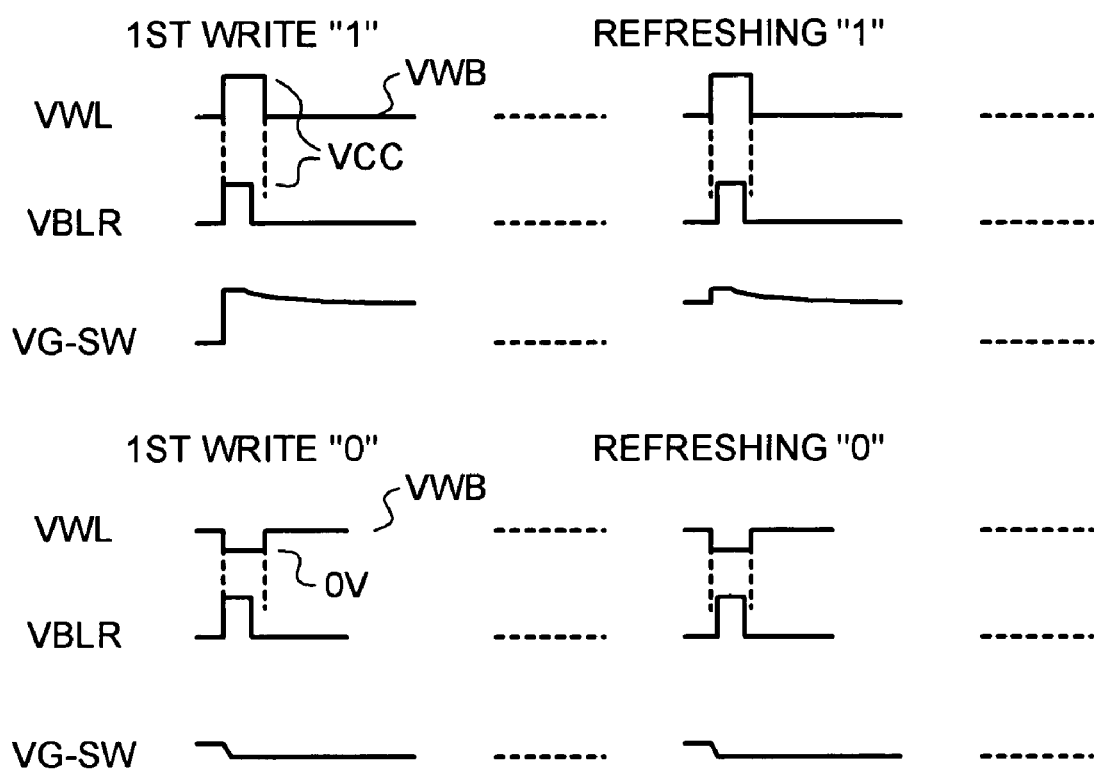
FIG. 7 is a timing diagram showing the storage of data onto the cell of FIG. 5.

During the writing or refreshing process, the waveforms have a time sequence on the WL and Bw that are designed in such a way to avoid discharging the data stored on the gate of control switch Tsw. More specifically, a WL with "1" should be ready at Vcc before Bw ($V_{blr}$) becomes Vcc which turns on the select NMOS switch (Tw) for refresh. Further, the Bw ($V_{blr}$) should become 0 volts to turn off the selected NMOS before WL drops back to 0 volts. This is illustrated in FIG. 7. Writing or refreshing a "0" is similar, but the Vwl is at 0V instead of Vcc. Further, during periods between sequential column refreshes, Vwl is set at a bias of Vwb (low) to reduce the leakage current resulting from the Tw source drain leakage ($I_{doff}$) common when a deep sub-micron process is used.

Note that since the write or refreshing process is done column by column, there is no need for a special decoding circuit for the columns (bit line) for the refresh process. Instead, a simple closed loop shift register chain can be used.

The dynamic memory of the present invention uses refresh or rewrite without reading. The reading of the dynamic memory of the present invention will typically destroy the stored data or disturb the controlled switch gate voltage. This is in contrast with conventional DRAM in which the data or charge stored has to be read out first then followed by a refresh operation to restore the data. This prevents DRAM cell from being directly used for FPGA switch control, which requires static states to provide "off" or "on" switches.

The dual nature of the memory array described above is useful in many applications. By having the capability to be dynamic memory and non-volatile memory, this will aid in prototyping applications. In those types of applications, the user needs to program the FPGA chip multiple times, and after finalizing the design, the user can permanently program the FPGA as described above.

As seen above, using constant writing to refresh the switch memory requires continuously reading the design bit map from a non-volatile memory (external or internal). For large FPGA chips which require very high density configuration non-volatile memory, the access speed, the data shift-in speed, refreshing cycling time and I/O errors, etc, will be limiting factors.

Figure 8:
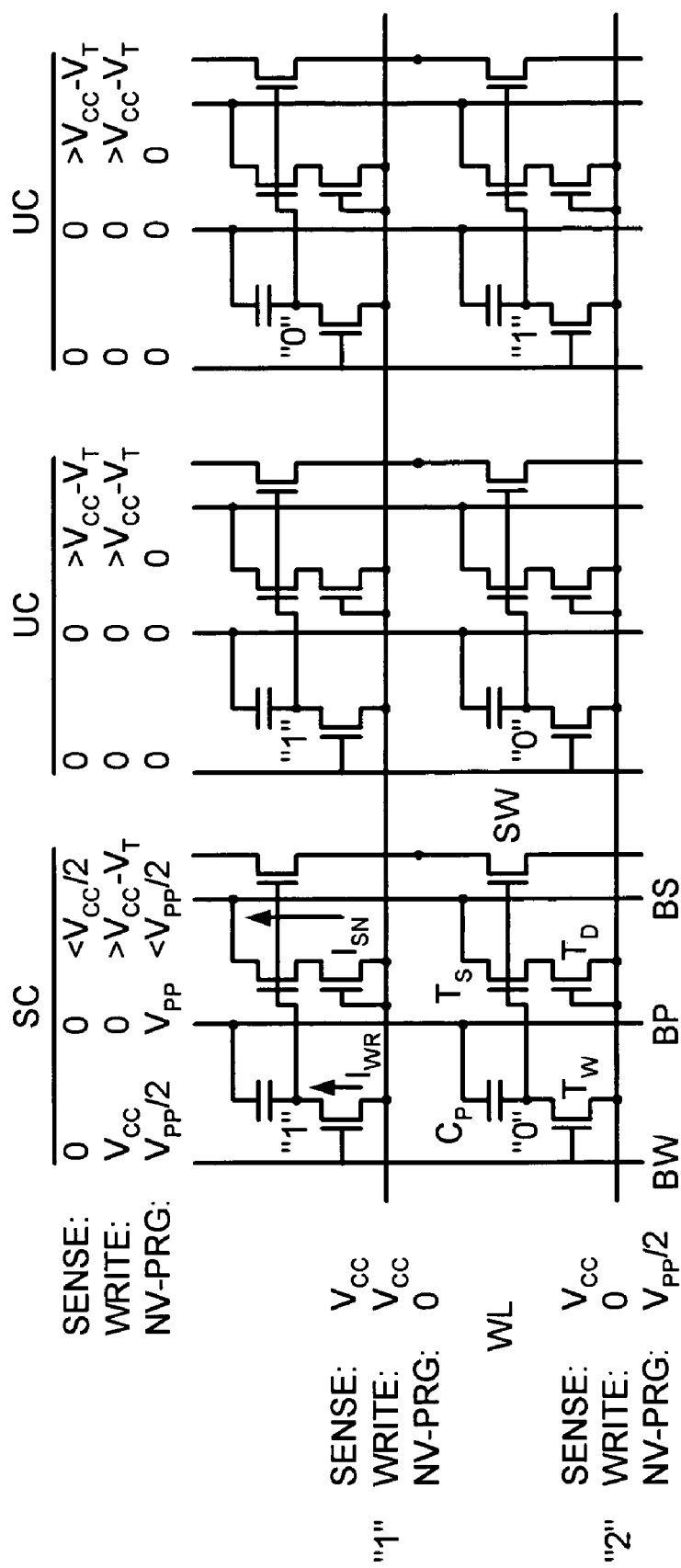
FIG. 8 is an alternative embodiment of a portion of a FPGA in accordance with another aspect of the present invention.

In order to resolve these issues, in accordance with another embodiment of the present invention, a small sense device (Ts), diode (Td), and sense bit line (Bs) are added in parallel as shown as in FIG. 8. This embodiment eliminates the need to constantly refresh from non-volatile memory, but instead is self-refreshing.

Figure 9:
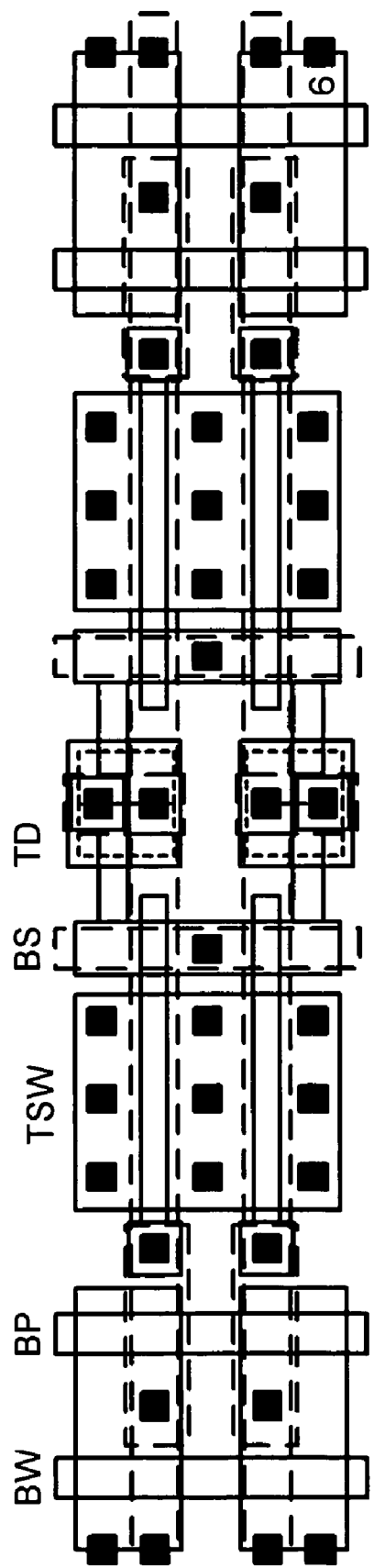
FIG. 9 is a top layout view of the circuit of FIG. 9.

The self-refreshing process has two operational steps: the sensing and refreshing. In the sensing operation, all selected WLs will be pre-charged to high (~Vcc), and the selected sense column (Bs) will be pulled down to low (between 0V and Vcc/2). Further, all unselected Bs's will be kept or pre-charged to high (between Vcc-Vt to Vcc) to prevent any leakage current from the WL lines to the unselected BS lines through cells with "1" (stored positive charge and the Ts is on). In this way, only one cell on one WL is selected. If the selected FPGA cell is at "1", the sense device (Ts) will be on, so it can conduct a sense current (Isn) and it will pull down the WL to low. If the FPGA cell is at "0" (off), the sense device will be off, there will be not current, and the WL will be kept at high. Thus, the sense and refresh circuitry can sense and remember (latch the data) the state of the cells on the selected column and refresh them. The bias conditions for sense, write and non-volatile programming are illustrated in FIG. 8. A top layout view is seen in FIG. 9.

It should be noted that the diode (Td) can be put on either side of the sense device (Ts), with the same polarity. It can also be placed on opposite polarity with proper bias arrangement to prevent the leakage current on the unselected columns.

It should also be noted that, the diode Td can either be made by a gated diode using a MOS device with its gate connected to either source or drain terminal, or by using a P-N junction. This FPGA cell array can also be made using PMOS devices sitting in either an N-well or on an N-type substrate.

Figure 10:
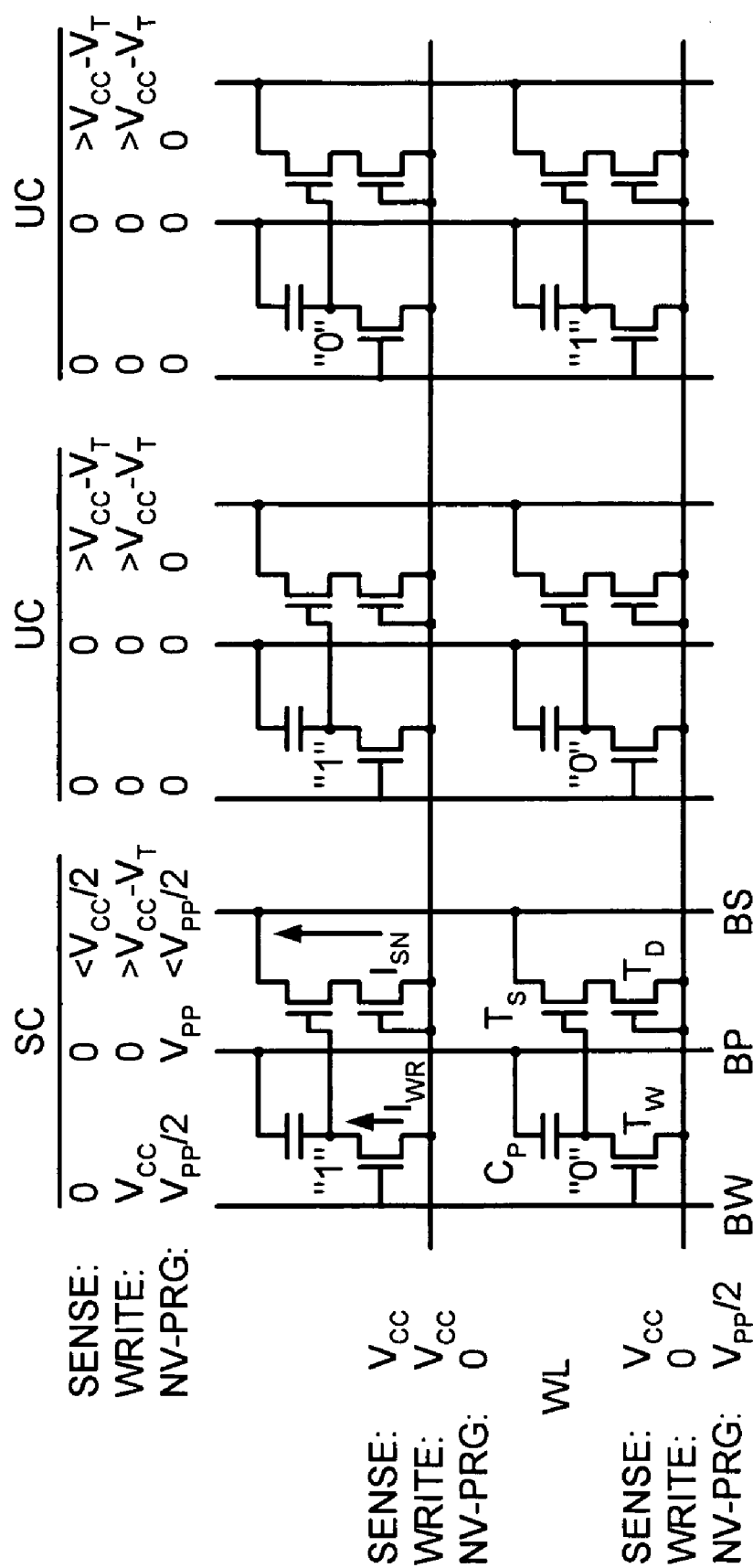
FIG. 10 is a schematic diagram of a portion of a dynamic memory array formed in accordance with the present invention.
Figure 11:
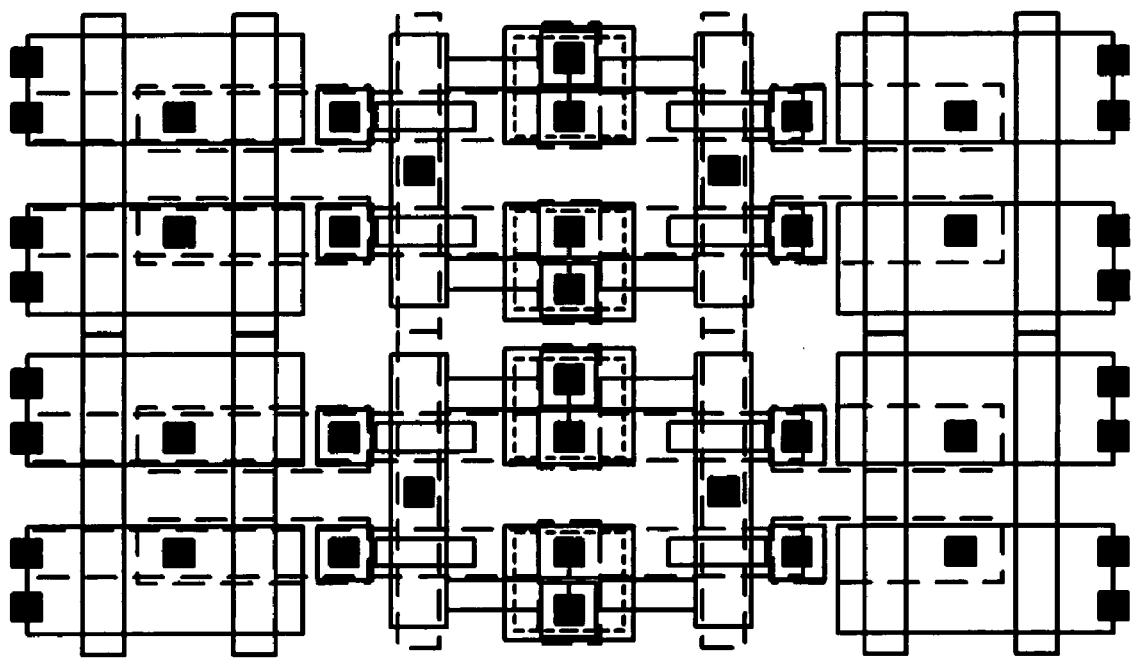
FIG. 11 is a top layout view of the circuit of FIG. 10.

As seen in FIGS. 10–11, the cell array without switch devices can be also used as DRAM memory based on standard CMOS process, but the sensing circuits are greatly simplified. Again, the diode can be put on either side of the sense device to prevent the leakage from unselected devices, and the diode can be made by gated MOS devices. It can also be made by PMOS devices.

Thus, as detailed above, the present invention discloses:
(1) A FPGA cell using dynamic memory to control a programmable switch.
(2) The dynamic memory is constantly refreshed without reading it out to destroy the stored data or disturb the controlled switch gate voltage. This is in contrast with conventional DRAM which the data stored has be read out first then followed by a refresh operation to restore the data.

(3) The dynamic memory has sense devices (Ts, Td) and a sense bit line (Bs) which enable the sensing of the memory without disturbing the charge stored or destroying the data. Further, this also enables a very high sense current; therefore a special sense amplifier is not required as in DRAM memory.

(4) A bias (Vwb) range from 0 to Vt is added onto the WL to prevent the leakage of the write transistor (Tw) from discharging a data "1". This means that the refresh cycle time can be greatly increased.

(5) A programming capacitor (Cp) and programming bit line (Bp) is added to the dynamic memory to make it non-volatile programmable.

(6) Sense, writing, or refreshing is done on a column by column basis.

(7) The array can be manufactured using standard CMOS logic process and process tuning is not required. Conventional DRAM requires special process turning.

(8) The cell array without the switch devices can be also used as DRAM memory based on standard CMOS process with the sensing circuits can be greatly simplified.

The description of the invention and its applications as set forth herein is illustrative and is not intended to limit the scope of the invention. Variations and modifications of the embodiments disclosed herein are possible, and practical alternatives to, or equivalents of the various elements, of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. Further, the various doping types may be reversed, such that an n-channel transistor described above may be replaced with a p-channel transistor. These and other variations and modifications of the embodiments disclosed herein may be made without departing from the scope and spirit of the invention.

What is claimed is:

1. A cell that is used as a dynamic memory cell for storing data or a field programmable gate array (FPGA) cell for programming, the cell useful in an array having column bitlines, read bitlines, and row wordlines, the cell comprising:
   a capacitor having a first terminal and a second terminal, the first terminal connected to a column bitline, said second terminal connected to a switch control node;
   a select transistor having a gate, a source, and a drain, said gate connected to said read bitline, said source connected to said switch control node, and said drain connected to a row wordline; and
   a switch being controlled by said switch control node, wherein said switch control node stores data as a voltage indicative of a one or a zero.

2. The cell of claim 1 wherein said switch is a MOSFET and a gate of said MOSFET being connected to said switch control node.

3. The cell of claim 1 wherein data is placed onto said switch control node by turning on said select transistor and placing the data onto said row wordline.

4. The cell of claim 1 wherein said first terminal of said capacitor, said gate of said select transistor and a gate of said switch is formed from the same layer of polysilicon.

5. A method of operating a dual mode cell that is connected to a row wordline, a column write bitline, a read bitline, said cell comprising a capacitor having a first terminal and a second terminal, the first terminal connected to said column write bitline, said second terminal connected to a switch control node, a select transistor having a gate, a source, and a drain, said gate connected to said read bitline, said source connected to said switch control node, and said drain connected to a row wordline, and a switch being controlled by said switch control node, the method comprising:
   when said cell is operating as a field programmable gate array (FPGA) cell and is to be programmed,
      (1) applying a first voltage to said column bitline;
      (2) turning on said select transistor; and
      (3) applying a second voltage to a selected one of the row wordlines, wherein the first voltage and the second voltage form a potential difference across said capacitor to break down a dielectric of said capacitor converting said capacitor into a resistive device;
   when said cell is operating as a dynamic memory cell to store data,
      (1) turning on said select transistor;
      (2) applying said data to said switch control node through said row wordline, wherein said switch control node stores said data as a voltage indicative of a one or a zero.

6. The method of claim 5 further including periodically refreshing said data when said cell is operating as a dynamic memory cell.

7. The method of claim 5 wherein said select transistor is turned off before the data on said row wordline is removed.

8. A cell that is used as a dynamic memory cell for storing data or a field programmable gate array (FPGA) cell for programming, the cell useful in an array having column bitlines, write bitlines, and row wordlines, the cell comprising:
   a capacitor having a first terminal and a second terminal, the first terminal connected to a column bitline (Bp), said second terminal connected to a switch control node;
   a select transistor having a gate, a source, and a drain, said gate connected to said write bitline (Bw), said source connected to said switch control node, and said drain connected to a row wordline (WL);
   a switch being controlled by said switch control node, wherein said switch control node stores data as a voltage indicative of a one or a zero;
   a sense device for determining the voltage on said switch control node.

9. The cell of claim 8 wherein said switch is a MOSFET and a gate of said MOSFET being connected to said switch control node.

10. The cell of claim 8 wherein data is placed onto said switch control node by turning on said select transistor and placing the data onto said row wordline.

11. The cell of claim 8 wherein said first terminal of said capacitor, said gate of said select transistor and a gate of said switch is formed from the same layer of polysilicon.

12. The cell of claim 8 wherein the sense device is a transistor having its gate connected to said switch control node and its drain connected to a sense bitline (Bs) and its source connected the said wordline (WL).

13. The cell of claim 12 further including a diode connected in series to said sense device and between said row wordline and said sense bitline.

14. A cell that is used as a dynamic memory cell for storing data, the cell useful in an array having column bitlines, write bitlines, and row wordlines, the cell comprising:
- a capacitor having a first terminal and a second terminal, the first terminal connected to a column bitline (Bp), said second terminal connected to a switch control node, said switch control node storing said data;
- a select transistor (Tw) having a gate, a source, and a drain, said gate connected to said write bitline (Bw), said source connected to said switch control node, and said drain connected to a row wordline; and
- a sense device for determining the data on said switch control node.

15. The cell of claim 14 wherein data is placed onto said switch control node by turning on said select transistor and placing the data onto said row wordline.

16. The cell of claim 14 wherein said first terminal of said capacitor, said gate of said select transistor and a gate of said switch is formed from the same layer of polysilicon.

17. The cell of claim 14 wherein the sense device is a transistor having its gate connected to said switch control node and its drain connected to a sense bitline (Bs).

18. The cell of claim 17 further including a diode connected in series to said sense device and between said row wordline and said sense bitline.

* * * * *